United States Patent
Boivin et al.

(10) Patent No.: US 10,998,378 B2
(45) Date of Patent: May 4, 2021

(54) METHOD FOR PRODUCING TRANSISTORS, IN PARTICULAR SELECTION TRANSISTORS FOR NON-VOLATILE MEMORY, AND CORRESPONDING DEVICE

(71) Applicant: STMicroelectronics (Rousset) SAS, Rousset (FR)

(72) Inventors: Philippe Boivin, Venelles (FR); Jean-Jacques Fagot, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/543,124

(22) Filed: Aug. 16, 2019

(65) Prior Publication Data
US 2019/0371858 A1 Dec. 5, 2019

Related U.S. Application Data

(62) Division of application No. 15/436,963, filed on Feb. 20, 2017, now Pat. No. 10,431,630.

(30) Foreign Application Priority Data

Sep. 9, 2016 (FR) ..................................... 1658405

(51) Int. Cl.
*H01L 29/423* (2006.01)
*H01L 27/24* (2006.01)
(Continued)

(52) U.S. Cl.
CPC ...... *H01L 27/2454* (2013.01); *H01L 21/2815* (2013.01); *H01L 21/76224* (2013.01);
(Continued)

(58) Field of Classification Search
CPC ............ H01L 27/2454; H01L 27/2815; H01L 27/76224; H01L 27/2463; H01L 45/1233;
(Continued)

(56) References Cited

U.S. PATENT DOCUMENTS

| | | | |
|---|---|---|---|
| 9,559,297 B2 | 1/2017 | Boivin et al. | |
| 2008/0124867 A1* | 5/2008 | Brown | H01L 27/108 438/268 |

(Continued)

FOREIGN PATENT DOCUMENTS

| | | |
|---|---|---|
| CN | 103872057 A | 6/2014 |
| FR | 3023647 A1 | 1/2016 |
| WO | 2005079182 A2 | 9/2005 |

OTHER PUBLICATIONS

INPI Search Report and Written Opinion for FR 1658405 dated Apr. 4, 2017 (9 pages).

(Continued)

*Primary Examiner* — Timor Karimy
(74) *Attorney, Agent, or Firm* — Crowe & Dunlevy

(57) ABSTRACT

A MOS transistor with two vertical gates is formed within a substrate zone of a semiconductor substrate doped with a first type of conductivity and separated from a remaining portion of the substrate by two first parallel trenches extending in a first direction. An isolated gate region rests on each flank of the substrate zone and on a portion of the bottom of the corresponding trench to form the two vertical gates. At least one gate connection region electrically connects the two vertical gates. A first buried region located under the substrate zone is doped with a second type of conductivity to form a first conduction electrode of the MOS transistor. A second region doped with the second type of conductivity is located at the surface of the substrate zone to form a second conduction electrode of the MOS transistor.

19 Claims, 5 Drawing Sheets

(51) Int. Cl.
    *H01L 21/28* (2006.01)
    *H01L 29/66* (2006.01)
    *H01L 21/762* (2006.01)
    *H01L 29/78* (2006.01)
    *H01L 45/00* (2006.01)

(52) U.S. Cl.
    CPC ...... *H01L 27/2463* (2013.01); *H01L 29/4236* (2013.01); *H01L 29/66484* (2013.01); *H01L 29/66666* (2013.01); *H01L 29/7827* (2013.01); *H01L 45/1233* (2013.01); *H01L 45/16* (2013.01); *H01L 45/06* (2013.01)

(58) Field of Classification Search
    CPC ..... H01L 45/16; H01L 45/06; H01L 29/4236; H01L 29/66484; H01L 29/66666; H01L 29/7827
    See application file for complete search history.

(56) References Cited

U.S. PATENT DOCUMENTS

| | | |
|---|---|---|
| 2010/0252879 A1 | 10/2010 | Ogawa et al. |
| 2011/0188288 A1 | 8/2011 | Minami |
| 2012/0080725 A1* | 4/2012 | Manos ................ H01L 27/2454 257/208 |
| 2012/0112270 A1 | 5/2012 | Park et al. |
| 2014/0169105 A1* | 6/2014 | Oh ...................... H01L 29/7926 365/185.29 |
| 2016/0013245 A1 | 1/2016 | Boivin et al. |

OTHER PUBLICATIONS

First Office Action and Search Report for co-pending CN Appl. No. 201710146962.1 dated Mar. 2, 2021 (9 pages).

\* cited by examiner

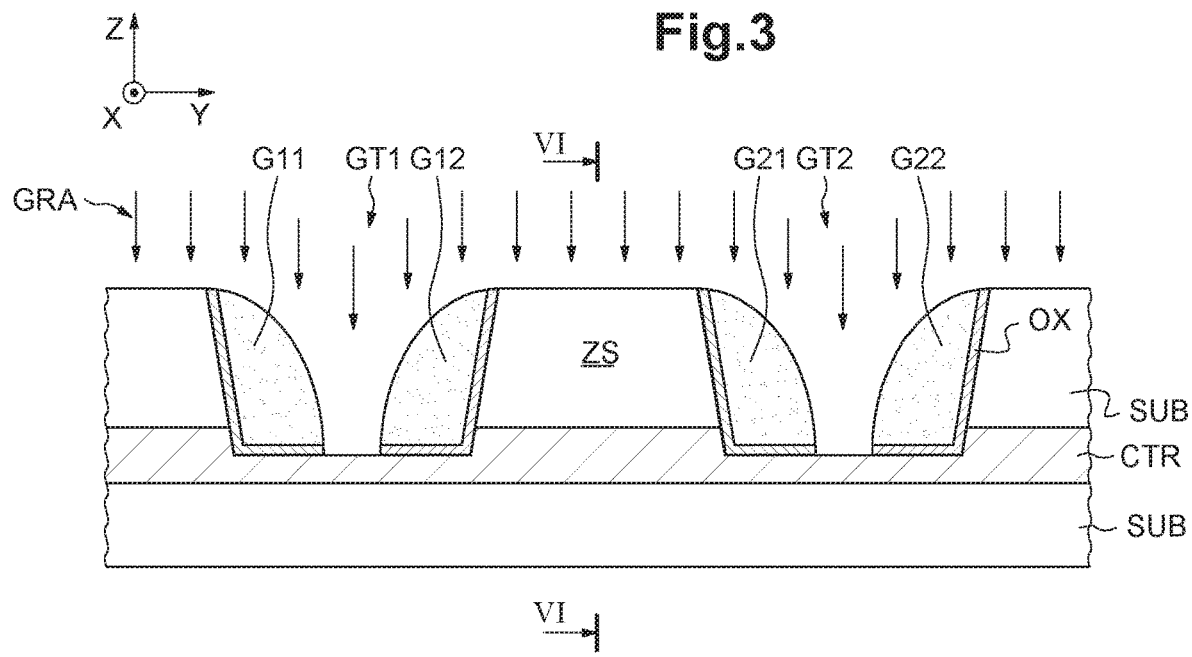
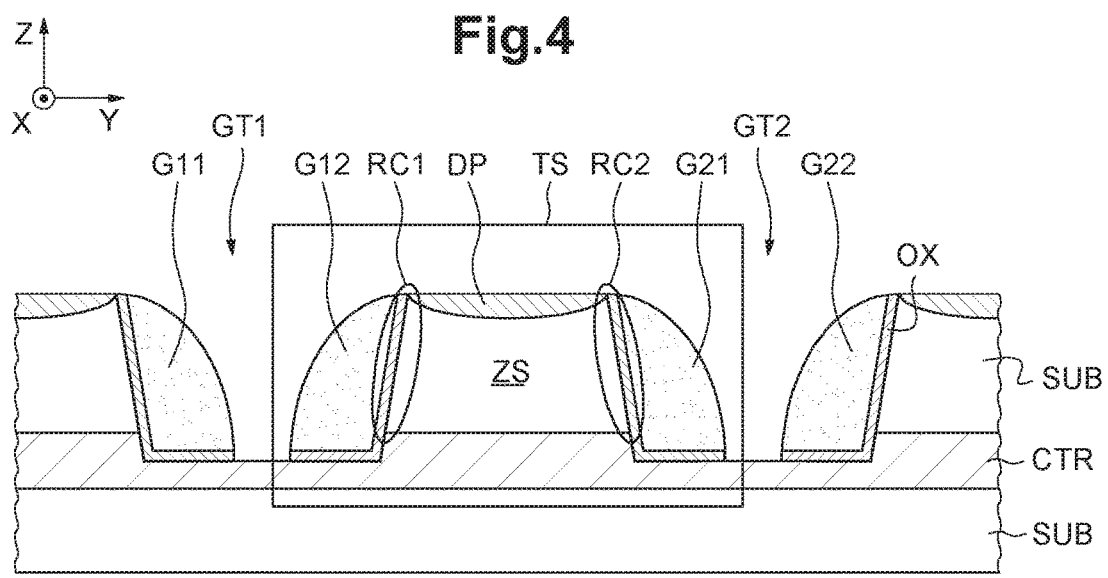

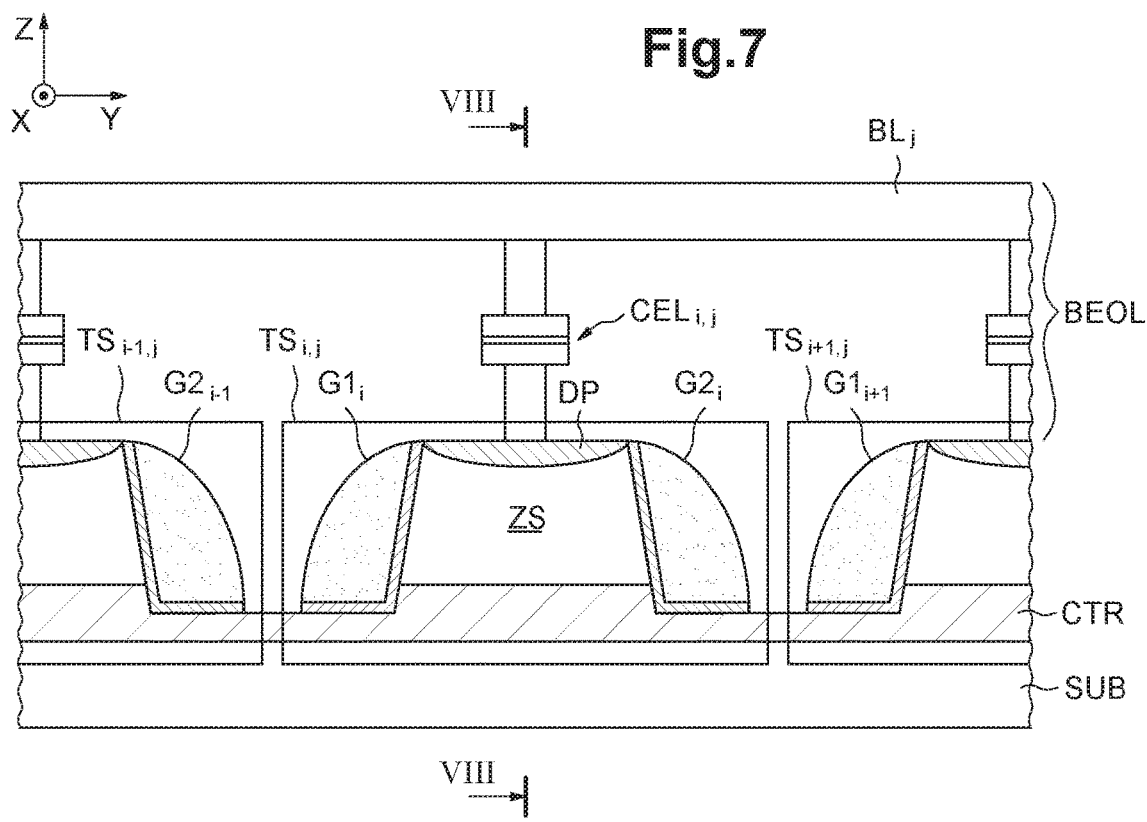
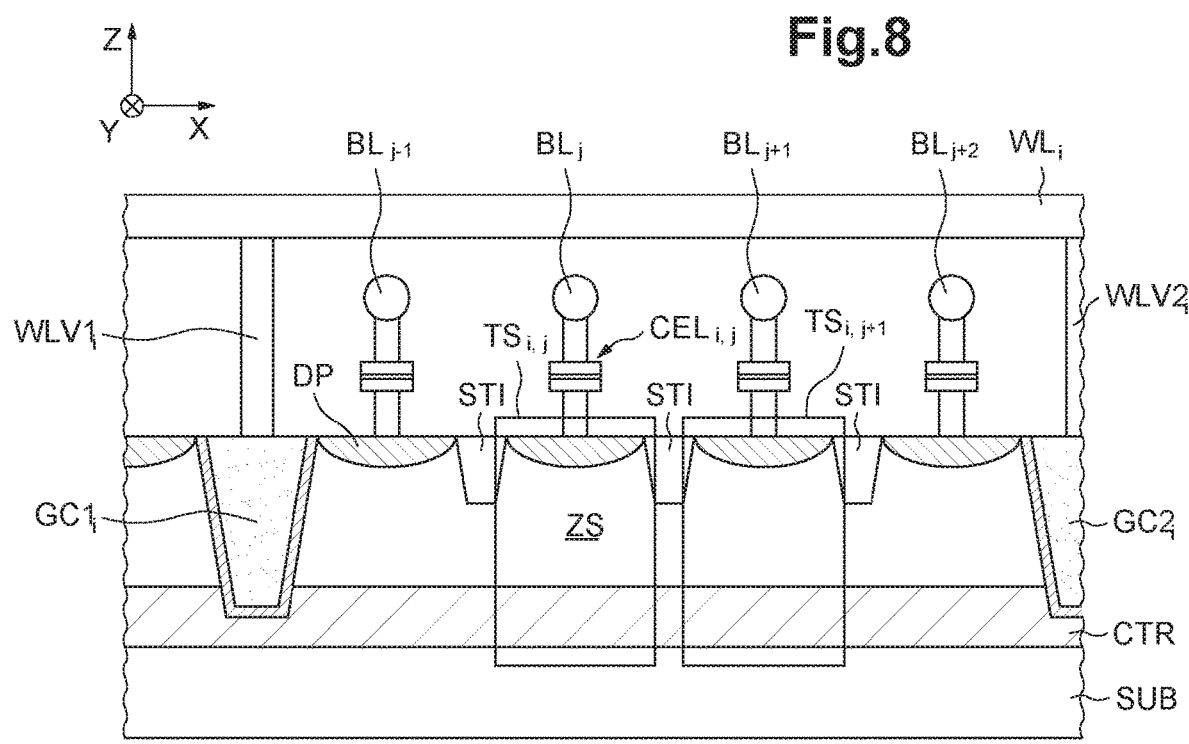

METHOD FOR PRODUCING TRANSISTORS, IN PARTICULAR SELECTION TRANSISTORS FOR NON-VOLATILE MEMORY, AND CORRESPONDING DEVICE

CROSS REFERENCE TO RELATED APPLICATIONS

This application is a divisional of U.S. patent application Ser. No. 15/436,963 filed Feb. 20, 2017, which claims the priority benefit of French Application for Patent No. 1658405, filed on Sep. 9, 2016, the disclosures of which are hereby incorporated by reference in their entireties.

TECHNICAL FIELD

Embodiments and modes of implementation relate to memory, and, more particularly, to methods for producing selection transistors for a resistive memory, and to corresponding devices.

BACKGROUND

Resistive memory, for example phase-change memory PCM or oxide-based random access memory OxRAM, usually comprises memory points each having a selection transistor and a memory cell that is capable of storing a logic datum, and which are distributed in a matrix along rows and columns in a memory plane. A memory cell is accessed through the selection transistor and via word lines along the rows of the memory plane and bit lines along the columns of the memory plane.

Resistive memory technologies are promising in numerous aspects, in particular in terms of density since the memory cell, incorporated within the back-end-of-line BEOL interconnect layers, may be superposed over the selection transistor formed in and on a semiconductor substrate, in contrast to "conventional" non-volatile memory, for example EEPROM or NAND flash, in which the memory cell is generally also formed in and on the semiconductor substrate.

Consequently, a limitation in terms of the compactness of the resistive memory memory points is the area occupied by a selection transistor.

In this regard it has been proposed, in United States Patent Application Publication No. 2016/0013245 (French Publication No. 3023647A1), incorporated by reference, to form vertical-gate selection transistors, which are more compact than planar transistors. However, in this configuration a vertical gate may introduce the formation of a parasitic conduction channel in an adjacent transistor, causing errors when accessing a memory cell. Doping a region facing a face of the gate makes it possible to limit the formation of such a parasitic conduction channel.

However, resistive memory cells may require a particularly large current for writing a datum.

SUMMARY

According to modes of implementation and embodiments, a solution of isolating two adjacent vertical selection transistors is proposed, allowing, in particular, more current to be dumped into a selection transistor and the area occupied by a selection transistor to be minimized.

According to a first aspect, a method is proposed for producing a MOS transistor with two vertical gates comprising: producing, in a semiconductor substrate having a first type of conductivity, a first buried region having a second type of conductivity so as to form a first conduction electrode of the transistor; etching, in the semiconductor substrate up to the first buried region, two first parallel trenches that extend in a first direction and delimit a substrate zone; forming, on each flank of the substrate zone and on a portion of the bottom of the corresponding trench, an isolated region comprising a gate material so as to form the two vertical gates; making an electrically conductive connection between the two gate regions; forming, on the surface of the substrate zone, a second region having the second type of conductivity so as to form a second electrode of the transistor.

Thus, the formation of the two vertical gates on each flank of the substrate zone allows substantially twice as much current as for a typical transistor having only one useful vertical gate to be dumped into the MOS transistor produced according to this aspect.

Additionally, the fact that said vertical gates rest on a portion of the bottom of the trench means that another portion of the bottom of the trench is not covered by a gate material, thereby leaving the advantageous possibility of electrically isolating each gate from a potential other neighboring gate region.

According to one mode of implementation, the two first trenches are wider than they are deep and the formation of the gate regions comprises an operation of depositing a gate oxide and a gate material on the substrate zone and in said trenches and an operation of anisotropically etching the gate material and the gate oxide until the surface of said substrate zone and another portion of the bottom of the corresponding trench is uncovered.

According to one mode of implementation, the production of the electrically conductive connection between the two gate regions comprises the formation of two second parallel trenches that are deeper than they are wide, extending in a second direction that is perpendicular to the first direction, and which are filled with the gate material and located on either side of the transistor.

These modes of implementation allow, on the one hand, the gates of a transistor to be isolated from possible neighboring structures and, on the other hand, more current to be carried than for a conventional transistor comprising only one gate.

Additionally, the formation of the substrate zones and gate regions via trenches is easily adapted to simultaneous production of transistors arranged along two directions of a plane.

Thus, such transistors are particularly advantageous in the capacity of selection transistors of a non-volatile memory, for example a resistive non-volatile memory.

For this reason a method is also proposed for producing an integrated circuit comprising a non-volatile memory having memory points each comprising a memory cell superposed over a selection transistor, in which the selection transistors are produced via the method defined above.

According to one mode of implementation, said electrically conductive connection is produced on either side of a group of selection transistors sharing their vertical gates, and which are arranged side-by-side in the first direction.

The method may additionally comprise the formation of metallic tracks extending in the first direction, which are electrically connected by vertical vias to said electrically conductive connections.

According to one mode of implementation, the production of the selection transistors comprises the formation of shallow trench isolations individually isolating, along the first direction, the portions of the second region that individually belong to each selection transistor.

Advantageously, the memory cells are resistive memory cells.

According to another aspect, an integrated circuit is proposed, comprising at least one MOS transistor with two vertical gates comprising a zone of a semiconductor substrate having a first type of conductivity separated from the rest of the substrate by two first parallel trenches extending in a first direction, an isolated gate region resting on each flank of the substrate zone and on a portion of the bottom of the corresponding trench and forming the two vertical gates, at least one gate connection region electrically connecting the two vertical gates, a first buried region located under the substrate zone having a second type of conductivity and forming a first conduction electrode of the transistor and a second region having the second type of conductivity located in the vicinity of the surface of the substrate zone and forming a second conduction electrode of the transistor.

Advantageously, the size of said portion of the bottom of the trench measured in a second direction that is perpendicular to the first direction is smaller than half of the size of the bottom of the trench measured in said second direction.

Advantageously, said two first trenches are wider than they are deep.

According to one embodiment, said at least one gate connection region comprises a second trench that is deeper than it is wide and which extends in a second direction that is perpendicular to the first direction.

As such a transistor is particularly advantageous in non-volatile memory devices, for example resistive non-volatile memory devices, the device may thus comprise memory points arranged in a matrix in rows extending in the first direction and in columns extending in a second direction that is perpendicular to the first direction in a memory plane formed in and on the semiconductor substrate, each memory point comprising a memory cell that is superposed over a MOS transistor with two vertical gates which forms a selection transistor.

Advantageously, said isolated gate regions that are located on the flanks facing the respective substrate zones of two selection transistors belonging to one and the same column and to a neighboring row are located in one and the same first trench and are at a distance from one another in the bottom of this first trench.

According to one embodiment, gate connection regions electrically connecting the two vertical gates are located on either side of a group of transistors belonging to one and the same row.

The device may comprise shallow trench isolations separating the second regions of the selection transistors of one and the same group.

The device may comprise word lines that extend in the first direction and which are electrically connected by vertical vias to said gate connection regions.

Advantageously, the memory cells are resistive memory cells.

An electronic apparatus, such as a personal computer, a mobile phone, or an on-board computer of an automobile, may advantageously comprise an integrated circuit such as defined above.

BRIEF DESCRIPTION OF THE DRAWINGS

Other advantages and features of the invention will become apparent on detailed examination of non-limiting embodiments and implementations and the appended drawings in which:

FIGS. 1 to 10 schematically show various structures obtained during the implementation of a production method according to various embodiments of an electronic circuit and an electronic apparatus.

DETAILED DESCRIPTION

Three directions X, Y, Z form an orthogonal basis for the space, and are indicated in each figure.

FIGS. 1 to 4 show cross-sectional views in a plane (Y, Z) of structures obtained in various steps of an exemplary method for producing a transistor with two vertical gates.

Figure 1:
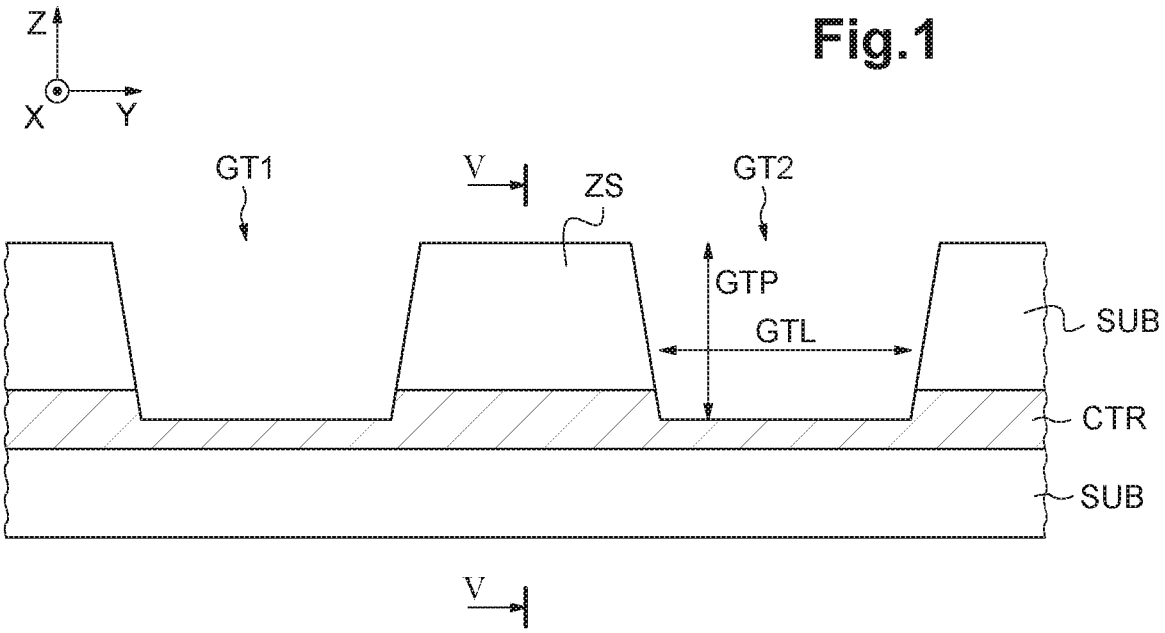

FIG. 1 shows a semiconductor substrate SUB, doped for example of P type, in which a first buried region CTR, doped for example of N type, commonly referred to by the acronym NISO (for n-type isolation region) by those skilled in the art, has been implanted at depth, and in which two first trenches, referred to as gate trenches GT1, GT2, are etched.

The gate trenches GT1, GT2 are formed so as to be identical and extend in parallel in the direction X.

The gate trenches GT1, GT2 are etched through an upper portion of the substrate SUB and at least partially into the buried layer CTR and are wider than they are deep (GTP<GTL), GTP and GTL denoting the depth and the width of a trench, respectively.

The gate trenches GT1, GT2 together delimit a substrate zone ZS that is separated from the rest of the substrate SUB by said gate trenches and the buried layer CTR.

The substrate zone ZS will eventually accommodate an active region of a transistor.

Thus, as will become apparent below, it is particularly the depth of the buried layer CTR that parametrizes the area occupied by a transistor.

Figure 2:
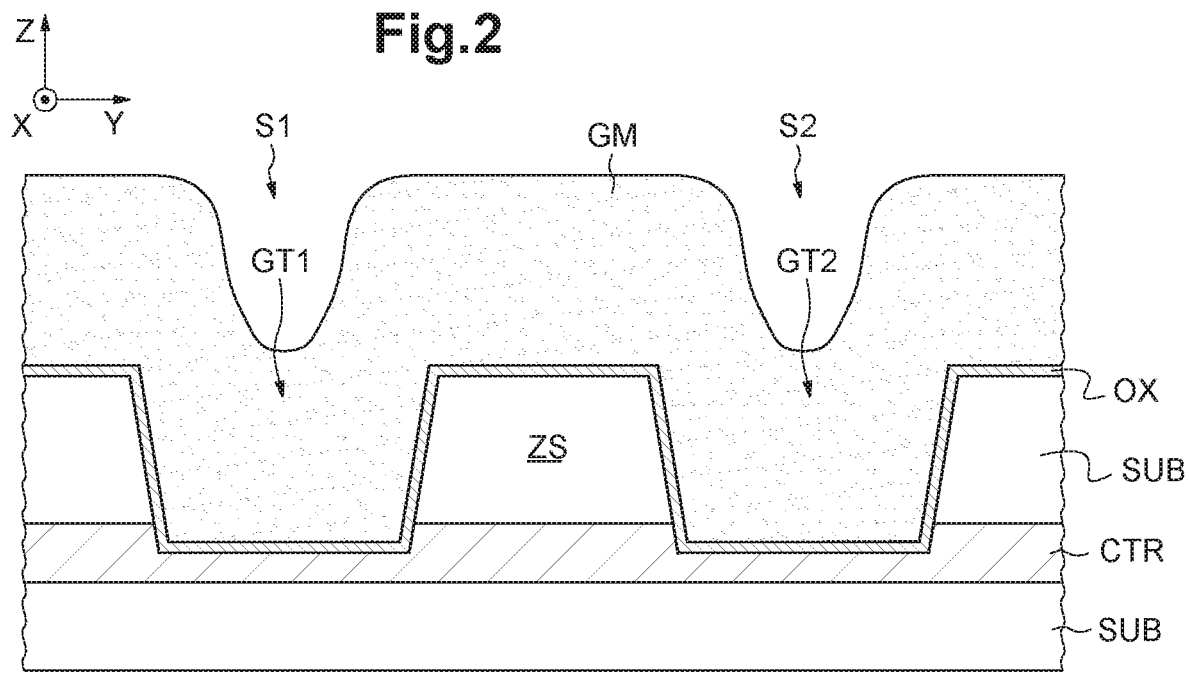

FIG. 2 shows the result of a step in which a gate material GM is deposited on the structure described in relation to FIG. 1.

In a conventional manner, a layer of gate oxide OX has been formed beforehand in said gate trenches GT1, GT2, allowing the gate material to be electrically isolated from the substrate and from the first doped region CTR.

The gate material GM may be, for example, vapor-phase-deposited polycrystalline silicon, or a metal deposited according to, for example, a Damascene process.

The deposition forms a layer of gate material GM whose thickness, taken perpendicularly to the surface on which it rests, is substantially constant. Said layer substantially hugs the form of the structure on which it has been deposited, with a tendency to blunt, or round off, the edge of said structure.

Thus, on the surface of the layer of gate material GM, this deposition results in a formation of furrows S1, S2 that are located facing the gate trenches GT1, GT2. Said furrows are substantially as deep as, but narrower than, the gate trenches.

FIG. 3 shows the structure obtained after anisotropically etching GRA, in the vertical direction Z, through the layer of gate material GM and through the previously deposited layer of gate oxide OX to reach the surface of the region CTR.

Conforming to the geometries of said gate trenches GT1, GT2 and said furrows S1, S2, the operation of vertically anisotropically etching GRA the gate material GM leads to the formation of two gate regions that are positioned against the lateral walls of each trench GT1, GT2 and at a distance from one another in the bottom of the trench.

Relative to the orientation of FIG. 3, the gate region positioned against the left lateral wall of the left trench GT1 is denoted by G11, and that against the right lateral wall by G12.

Relative to the orientation of FIG. 3 and in a homologous manner, the gate regions positioned against the left and right lateral walls of the right trench GT2 are denoted by G21 and G22, respectively.

Stated otherwise, a first isolated gate region G12 is formed on the left flank of the substrate zone ZS and on a portion of the bottom of the trench GT1, and a second isolated gate region G21 is formed on the right flank of the substrate zone ZS and on a portion of the bottom of the trench GT2.

This formation may be likened to a typical formation of spacers in a dielectric material surrounding, for example, a gate region of a conventional planar MOS transistor.

Next, as shown in FIG. 4, a second doped region DP is implanted into the surface of the substrate zone ZS.

The structure located between the two gate trenches GT1, GT2 thus obtained forms a transistor TS with two vertical gates G12, G21.

The first doped region CTR located at depth forms, in this instance, the source of the transistor TS and the second doped region DP located on the surface of zone ZS forms, in this instance, the drain of the transistor TS.

The gate regions G12 and G21, positioned on the flanks of the substrate zone ZS, form the two vertical gates of the transistor TS.

Two conduction channels, for a single transistor TS, may be formed in two respective channel regions RC1, RC2, located in the active region between the source and the drain along the flanks on which said vertical gates G12, G21 are located, respectively.

The implantation of the second doped region DP may be, for example, of N type, thus forming an NMOS transistor with two vertical gates.

It is apparent in FIG. 4 that the width, in the direction Y, of a transistor TS depends on the width of a vertical gate, namely substantially the half-width of a gate trench. In turn, the width of a gate trench GTL depends on the depth of the buried layer CTR. Thus, the depth of implantation of the layer CTR is a parameter having an influence on the area occupied by the transistor TS.

However, in particular for reasons related to the control of anisotropic etching and gate material deposition techniques, this production may occupy an area of 2F×2F, where F is the common notation for the smallest dimension achievable using a given technique.

Figure 5:
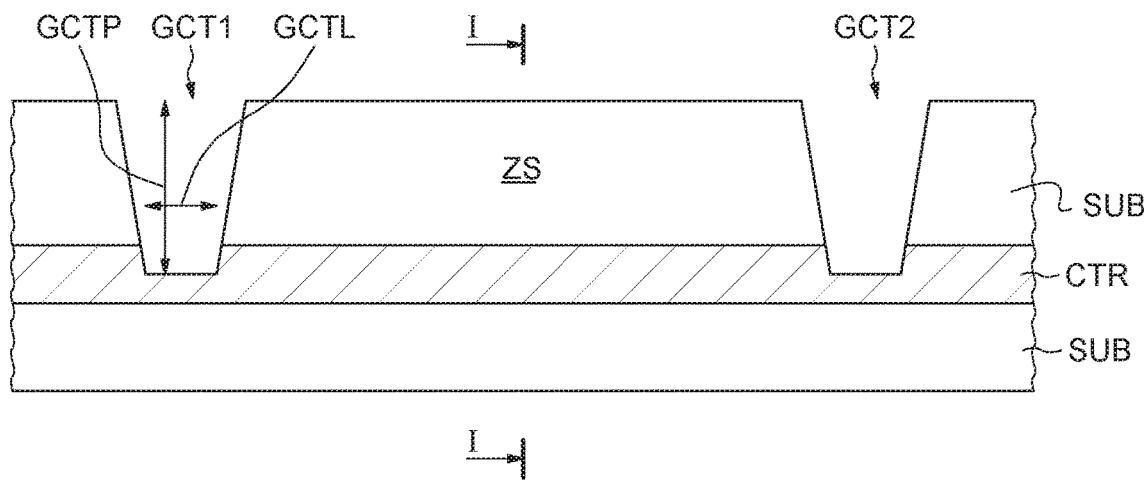
Figure 6:
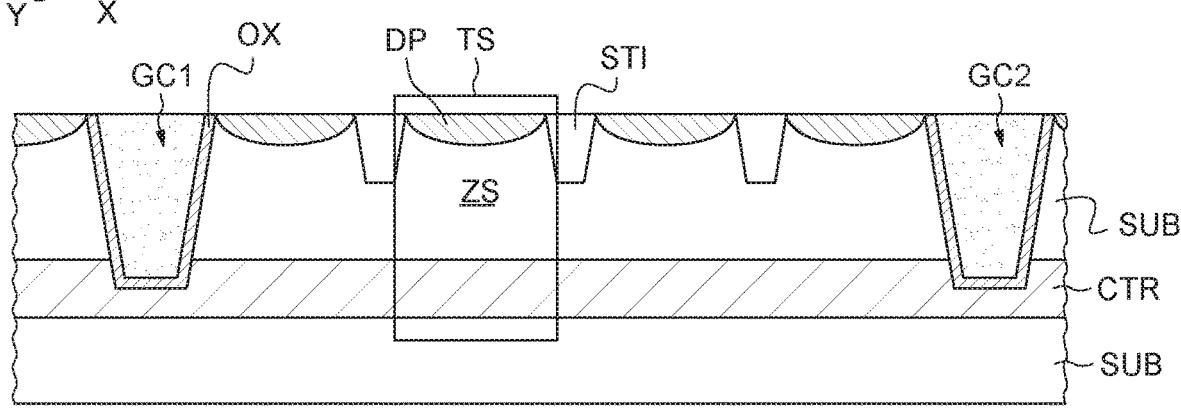

FIGS. 5 and 6 show cross-sectional views in a plane (X, Z) of the structures obtained in steps for producing transistors TS, and, more particularly, producing gate connection regions allowing, in particular, the two gates of a transistor TS to be electrically connected to one another.

FIG. 5 shows a cross-sectional view in the plane (X, Z) corresponding to the plane V-V of FIG. 1. The sectional plane of FIG. 1 corresponds to the plane I-I of FIG. 5.

In the step of etching the first gate trenches GT1, GT2, two second trenches GCT1, GCT2, referred to as gate connection trenches, are also etched in the semiconductor substrate SUB extending through the upper portion of the substrate and at least partially into the buried layer CTR.

The gate connection trenches extend parallel to the direction Y and are deeper than they are wide (GCTP>GCTL), where GCTP is the depth and GCTL the width of a gate connection trench (furthermore, GCTP=GTP).

The second trenches GCT1, GCT2 are etched, in the direction X, on either side of a zone ZS of the substrate corresponding to an active region of a transistor, or corresponding to multiple respective active regions of multiple transistors forming a group.

FIG. 6 shows a cross-sectional view in the plane (X, Z) corresponding to the plane VI-VI of FIG. 3. The sectional plane of FIG. 3 corresponds to the plane of FIG. 6.

The gate material has been deposited then etched in the manners described in relation to FIGS. 2 and 3, forming gate connection regions GC1, GC2 that fill the respective gate connection trenches GCT1, GCT2.

The gate connection regions GC1, GC2 connect the two vertical gates G12, G21 of the transistor TS to one another. In this representation, the gate connection regions GC1, GC2 connect the two vertical gates G12, G21 of the transistors belonging to one and the same group to one another, which group is formed, in this instance, by four transistors, whose gates are consequently shared.

Additionally, between each transistor of a group, shallow trench isolations STI have been formed which individually isolate, in the direction X, the portions of the second doped region DP that individually belong to one transistor of the group.

This method has been described in relation to the formation of a single group of transistors. However, this method may easily be adapted to the production of a single transistor, or of a multiplicity of transistors side-by-side and arranged individually or in groups, for example by reproducing, in the directions X and Y of the memory plane, the configuration described above for producing the selection transistors.

In particular, the unused gate regions G11 and G22 will each serve as transistor gates directly neighboring one another in the Y direction.

The transistors thus formed may advantageously be employed as selection transistors for a memory plane, for example for a resistive non-volatile memory.

Figure 9:
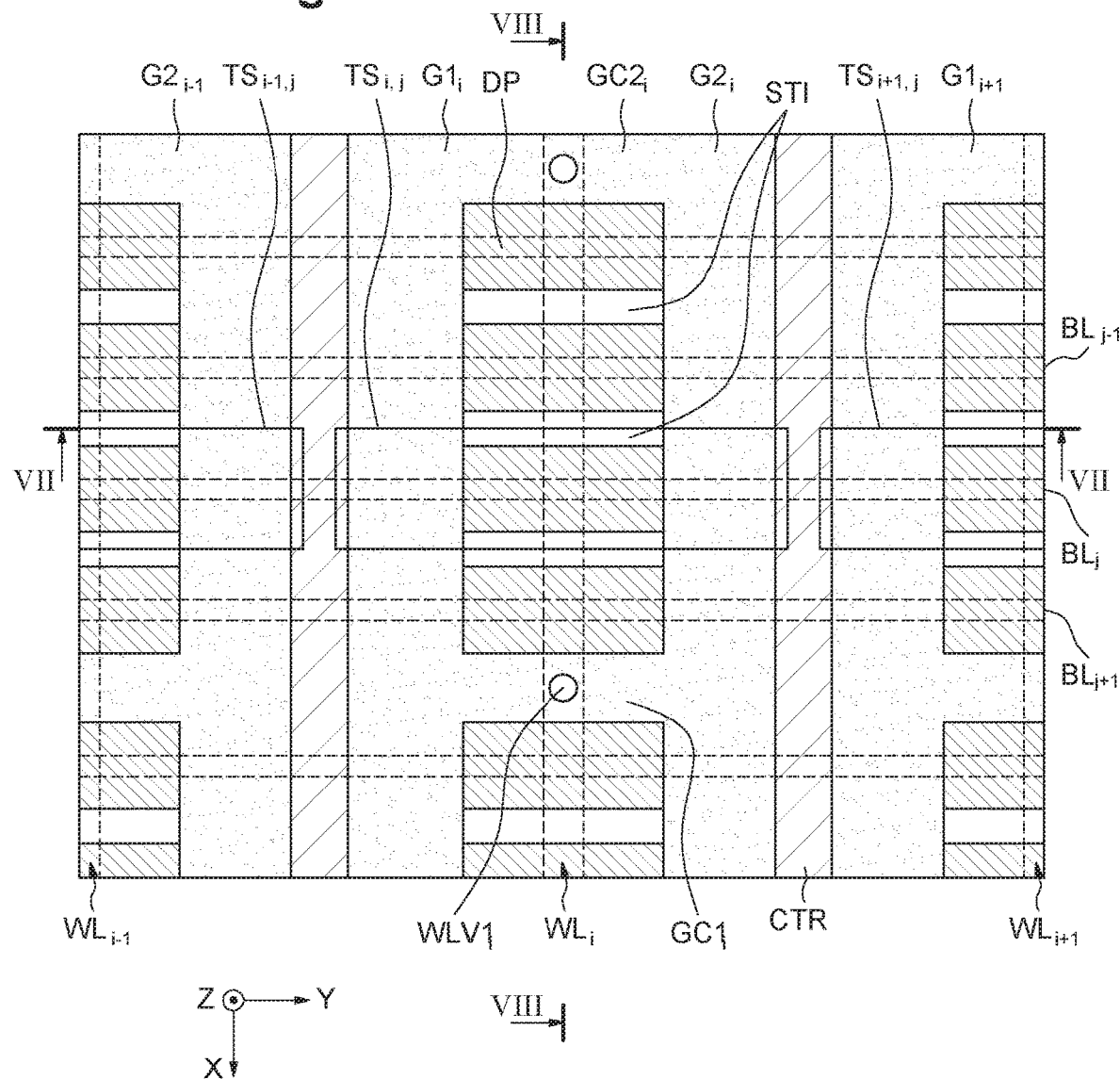

FIGS. 7 to 9 show, in various sectional planes, the structure obtained after having formed, within BEOL interconnect layers, a resistive memory cell $CEL_{i,j}$ superposed over each of the selection transistors.

The structure thus obtained forms a memory plane of a resistive memory, comprising memory points that are arranged in a matrix, in rows in the direction X and in columns in the direction Y. Each memory point comprises a selection transistor and a resistive memory cell.

A resistive memory cell usually comprises a resistive structure, comprising, for example, a phase-change material.

Voltages applied to the terminals of the resistive structure allow the resistivity of the resistive structure to be modified in a permanent and reversible manner and thus a logical datum represented by said resistivity to be stored.

However, in FIGS. 7 to 9, the elements in common with the preceding figures bear the same reference along with the row "i" to which they belong and/or the column "j" to which they belong in subscript. For the sake of clarity, the gate regions previously denoted by G11, G12, G21, G22, are in this instance denoted by $G2_{i-1}$, $G1_i$, $G2_i$, $G1_{i+1}$, respectively.

FIG. 7 shows a cross-sectional view in a plane (Y, Z) of one portion of a memory plane of a non-volatile memory device comprising selection transistors $TS_{i,j}$ produced via the method described in relation to FIGS. 1 to 6.

The memory cell $CEL_{i,j}$ is connected to the drain of the selection transistor $TS_{i,j}$ and to a metallic track, referred to as a bit line $BL_j$, along the direction Y of the columns of the memory plane through metallic vias made in the BEOL interconnect layers of the integrated circuit.

The production method described above makes it possible, in particular, for the vertical gate $G1_i$ of the transistor $TS_{i,j}$ to be electrically isolated from the vertical gate $G2_{i-1}$ of the transistor $TS_{i-1,j}$ belonging to the same column j and to an adjacent row i−1, even though said gates G1$_i$, G2$_{i-1}$ have been formed in the same trench.

Likewise, the vertical gate G2$_i$ of the transistor TS$_{i,j}$ is electrically isolated from the vertical gate G1$_{i+1}$ of the transistor TS$_{i+1,j}$ belonging to the same column j and to an adjacent row i+1, even though said gates G2$_i$, G1$_{i+1}$ have been formed in the same trench.

Thus, each vertical gate of each selection transistor is electrically isolated from the vertical gates of the selection transistor of a memory cell belonging to the same column and to a neighboring row.

Accessing a memory cell by selecting its row may be done via the gates thus formed in trenches extending in the direction X of said rows of the memory plane.

However, it is advantageous to regularly make gate connections to metallic tracks along the direction X, in particular for reasons related to controlling the conductivity of the tracks for accessing a memory cell.

FIG. 8 shows a cross-sectional view in a plane (X, Z) corresponding to the plane VIII-VIII of FIG. 7. The sectional plane of FIG. 7 corresponds to the plane VII-VII of FIG. 8.

The gate connection regions GC1$_i$, GC2$_i$ also allow contact to be made by respective vertical metallic vias WLV1$_i$, WLV2$_i$ with a word line WL$_i$ extending over the memory plane in the direction X of the rows.

Said contacts are made regularly, for example by groups of transistors.

One group of transistors comprises, for example, at least four transistors, depending on the conduction conditions preferred by the gate material GM and the implementation requirements of the device thus produced.

FIG. 9 shows a top view of the structure described in relation to FIGS. 7 and 8, their sectional planes corresponding to the planes VII-VII and VIII-VIII, respectively, of FIG. 9.

Each memory point formed by a memory cell CEL$_{i,j}$ that is superposed over a respective selection transistor TS, is connected to a bit line BL$_j$ and to a word line WL$_i$.

The bit lines BL$_j$ and the word lines WL$_i$ are formed within the BEOL interconnect layers by metallic tracks extending in the directions of the columns Y and the rows X of the memory plane, respectively, and thus allow a memory point to be selected in the matrix in order to access it.

A memory point is connected to a bit line BL$_j$ by a metallic via making contact with one terminal of the memory cell CEL$_{i,j}$ the other terminal being connected, also by a metallic via, to the drain of the selection transistor TS$_{i,j}$ of the memory point.

A memory point is connected to a word line WL$_i$ by metallic vias WLV$_i$ making contact with the gate connection regions GC1$_i$, GC2$_i$, which regions are connected to each vertical gate G1$_i$, G2$_i$ on either side of the selection transistors TS$_{i,j}$ of one and the same row i.

The selection transistors of the memory plane thus obtained may, in particular, carry twice as much current as a vertical transistor having only one gate and are not subject to the formation of parasitic conduction channels.

The vertical design of the transistors provides substantial savings in terms of the area occupied by each transistor, said area being, in particular, parametrized and adjustable by the depth of implantation of the buried layer.

Additionally, this method is compatible with the methods already in existence, and the structure obtained functions in a similar manner to existing technologies, for example in terms of accessing a memory point by means of row and column decoders.

Figure 10:
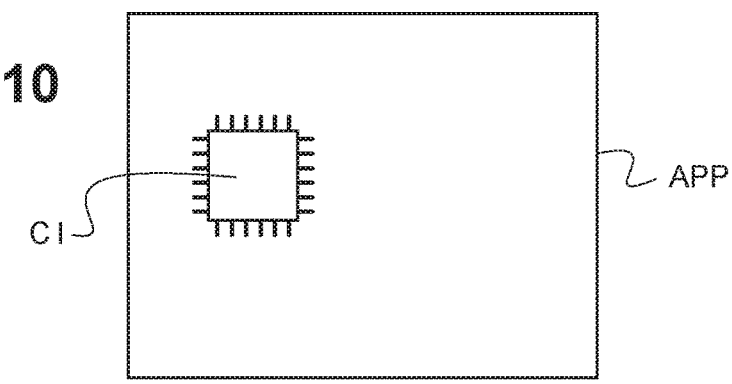

FIG. 10 shows an electronic apparatus APP, such as a personal computer, a mobile phone, or an on-board computer of an automobile, comprising an integrated circuit CI obtained through the implementation of the method described in relation to FIGS. 1 to 9, equipped, for example, with a resistive non-volatile memory.

The invention claimed is:

1. An integrated circuit, comprising:
   a plurality of MOS transistors with two vertical gates comprising:
      a substrate zone of a semiconductor substrate doped with a first type of conductivity and having flanks defined by two first parallel trenches extending in a first direction,
      an isolated gate region resting on each flank of the substrate zone and on a portion of a bottom of a corresponding trench of said two first parallel trenches to form said two vertical gates,
      a gate connection region electrically connecting the two vertical gates,
      a first buried region located under the substrate zone and doped with a second type of conductivity to form a first conduction electrode of each MOS transistor,
      a plurality of second regions doped with the second type of conductivity and located at a surface of the substrate zone to form second conduction electrodes of the plurality of MOS transistors, and
      a trench isolation region located at the surface of, and extending into, the substrate zone, wherein each trench isolation region is positioned between two of said second regions in the substrate zone.

2. The integrated circuit according to claim 1, wherein a size of said portion of the bottom of the corresponding trench measured in a second direction that is perpendicular to the first direction is smaller than half of a size of the bottom of the corresponding trench measured in said second direction.

3. The integrated circuit according to claim 1, wherein each trench of said two first parallel trenches has a width greater than a depth.

4. The integrated circuit according to claim 1, wherein said gate connection region comprises a second trench having a depth greater than a width and which extends between the two first parallel trenches in a second direction that is perpendicular to the first direction.

5. The integrated circuit according to claim 1, further comprising a plurality of memory cells superposed over said plurality of MOS transistors with two vertical gates, wherein each MOS transistor is electrically connected to one memory cell and functions as a selection transistor.

6. The integrated circuit according to claim 5, wherein the electrically connected MOS transistor and memory cell form a memory point, and wherein the memory point is one of a plurality of memory points arranged in a matrix of rows extending in the first direction and columns extending in a second direction that is perpendicular to the first direction.

7. The integrated circuit according to claim 6, wherein said isolated gate regions that are located on the flanks facing the respective substrate zones of two selection transistors belonging to one and the same column and to a neighboring row are located in one and the same trench of said two first parallel trenches and are at a distance from one another in the bottom of said same trench.

8. The integrated circuit according to claim 6, wherein gate connection regions electrically connecting the two vertical gates are located on either side of a group of selection transistors belonging to one and the same row.

9. The integrated circuit according to claim 8, wherein said shallow trench isolations separate the second regions of the selection transistors of one and the same group.

10. The integrated circuit according to claim 6, further comprising word lines that extend in the first direction and which are electrically connected by vertical vias to said gate connection regions.

11. The integrated circuit according to claim 5, wherein the memory cell is a resistive memory cell.

12. The integrated circuit according to claim 1, wherein the integrated circuit is a component of an electronic apparatus, said electronic apparatus selected from a group consisting of: a personal computer, a mobile phone, and an on-board computer of an automobile.

13. The integrated circuit according to claim 1, wherein the trench isolation regions penetrate into the substrate zone to a depth which is deeper than a depth of the plurality of second regions, but less than a depth of the two first parallel trenches.

14. A plurality of MOS transistors commonly controlled by two vertical gates, comprising:
a semiconductor substrate doped with a first type of conductivity;
a first buried region in the semiconductor substrate, said first buried region doped with a second type of conductivity so as to form a first conduction electrode of the plurality of MOS transistors;
two first parallel trenches in the semiconductor substrate that extend in a first direction;
two second parallel trenches in the semiconductor substrate that extend in a second direction perpendicular to the first direction;
wherein the first and second parallel trenches surround a substrate zone having a width and length, wherein the length of the substrate zone extends in the first direction and is greater than the width which extends in the second direction;
an isolated region comprising a gate material on each flank of the substrate zone along said length of the substrate zone in said two first parallel trenches, wherein the isolated region comprising the gate material forms the two vertical gates;
an electrically conductive connection between the two vertical gates on each flank of the substrate zone along said width of the substrate zone in said two second parallel trenches; and
a plurality of second regions doped with the second type of conductivity at a top surface of the substrate zone, wherein the second regions are insulated from each other and arranged in a row along the length of the substrate zone so as to form second conduction electrodes of the plurality of MOS transistors.

15. The plurality of MOS transistors according to claim 14, wherein the two first parallel trenches each have a width in the second direction that is greater than a depth in the depth direction.

16. The plurality of MOS transistors according to claim 14, wherein the two second parallel trenches each have a depth greater than a width in the first direction.

17. The plurality of MOS transistors according to claim 14, further comprising a plurality of memory cells superposed over said plurality of MOS transistors with two vertical gates, wherein each MOS transistor is electrically connected to one memory cell and functions as a selection transistor.

18. The plurality of MOS transistors according to claim 17, wherein the electrically connected MOS transistor and memory cell form a memory point.

19. The plurality of MOS transistors according to claim 14, wherein the integrated circuit is a component of an electronic apparatus, said electronic apparatus selected from a group consisting of: a personal computer, a mobile phone, and an on-board computer of an automobile.

* * * * *